United States Patent
Ryu et al.

[19]

[11] Patent Number: 6,133,860
[45] Date of Patent: Oct. 17, 2000

[54] VARIABLE LENGTH DECODER WITH ENHANCED ROUTING OF DATA TO MULTIPLEXERS

[75] Inventors: Seung-Chol Ryu, Taegu; Yong-Hwan Kim, Kyongsangbuk-do, both of Rep. of Korea

[73] Assignee: Hyundai Electronics Industries Co., Ltd., Kyoungki-Do, Rep. of Korea

[21] Appl. No.: 09/186,637

[22] Filed: Nov. 6, 1998

[30] Foreign Application Priority Data

Nov. 8, 1997 [KR] Rep. of Korea ............. 97-58867

[51] Int. Cl.[7] ...................................... H03M 7/40
[52] U.S. Cl. ................................. 341/67; 341/65
[58] Field of Search ..................... 341/50, 67, 65, 341/63

[56] References Cited

U.S. PATENT DOCUMENTS

| | | | |
|---|---|---|---|
| 5,561,690 | 10/1996 | Park | 341/67 |
| 5,625,356 | 4/1997 | Lee et al. | 341/67 |
| 5,648,775 | 7/1997 | Kim | 341/67 |
| 5,650,781 | 7/1997 | Park | 341/67 |
| 5,677,690 | 10/1997 | Sohn | 341/67 |
| 5,781,135 | 7/1998 | Kim | 341/67 |

OTHER PUBLICATIONS

Shih–Fu Chang et al., IEEE Transactions on Circuits and Systems for Video Technology, vol. 2, No. 2, pp. 187–196, Jun. 1992.

*Primary Examiner*—Peguy JeanPierre

[57] ABSTRACT

The present invention relates to a variable length decoder having a reduced size of a chip achieved by decreasing the size of the output data and simultaneously enabling effective input/output data processing. The present invention includes: a control signal generator for generating a data access control signal, a multiplexing control signal and a shift control signal wherein the control signal generator is supplied with the word length of data to be outputted; a first data storage device wherein a shift of a previously-stored data is executed when the data access control signal is activated and new data is inputted into a space vacated by the shift; a multiplexing device for outputting selectively a portion of data stored in the first data storage device according to the multiplexing control signal; and a shifter for varying a shift pointer according to a value of the shift control and for operating upon data from the multiplexing device.

9 Claims, 4 Drawing Sheets

VARIABLE LENGTH DECODER WITH ENHANCED ROUTING OF DATA TO MULTIPLEXERS

BACKGROUND OF THE INVENTION

1. Field of the Invention

The present invention relates to a variable length decoder having a reduced chip size made possible by decreasing the size of the output data and simultaneously enabling effective input/output data processing.

2. Discussion of the Related Art

Two popular international standards, JPEG (Joint Picture Experts Group) or MPEG (Moving Picture Experts Group) of the video compression art represent video signals using the DCT (Discrete Cosine Transform).

The video information of each pixel block, i.e. the variations of luminance and chrominance, is negligible through the whole picture in general video signals. However, the coefficients of the DCT (Discrete Cosine Transform) of the video signals are distributed unevenly, i.e., are decorelated, to the low portion of the spatial frequency after transformation. Accordingly, the information compression is achieved by retaining the low frequency portion (including most of the information necessary for restoring the video information) but discarding the high frequency portion. That is the major reason why DCT is used in JPEG or MPEG.

The average length of the symbol can be reduced when establishing a new symbol system (or codebook) between a decoder and an encoder by allotting a short length symbol to the high probability transform coefficients and allotting a long length symbol to the low probability transform coefficients. Implementation of such a codebook is achieved by a Variable Length Encoder and a corresponding Variable Length Decoder. Thus, the length of each unit data block processed in the variable length decoder and encoder becomes variable as well.

FIG. 1 shows the block diagram of a variable length decoder according to a related art.

Referring to FIG. 1, a variable length decoder has an input buffer 10, an output buffer 70, a programmable logic array 60 for decoding data and a variable block for varying the data length to be transferred from the input buffer 10 to the programmable logic array 60. The variable block consists of a pair of latches 20 and 30, a 32 bit barrel shifter 40 and an accumulator 50.

Encoded data outputted from a variable length encoder is inputted to the input buffer 10. The data stored in the input buffer 10 is accessed by the latch 20 in units of 16 bits according to a latch enabling signal L. The data stored in the latch 20 is also transferred to the other latch 30 under the control of the latch enabling signal L. Together the latches 20 and 30 hold 32 bits of data.

The barrel shifter 40, into which 32 bits of data are inputted, has a 4 bit shift pointer and a 16 bit output. The upper 16 bits of data in the barrel shifter 40 come from the latch 20 while the lower 16 bits of data in the barrel shifter 40 come from the other latch. The shift pointer S indicates the initial bit of the valid data. A length of 4 bits is enough for the length of the shift pointer S since the maximum number of bits transferred at one instance the from the barrel shifter 40 to the logic array 60 are 16. Such a shift pointer S is supplied from the accumulator 50.

The accumulator 50 has a binary value of 0000 as an initial value for the shift pointer, into which word length W of 4 bits from the programmable logic array 60 is inputted. Accordingly, a new word length W is accumulated in the shift pointer S where the previous value had been stored. The result of the accumulation is outputted as the shift pointer S of the barrel shifter 40. The carry output, C, of the accumulator generates the latch enabling signal, L. Once the carry output, C, of the accumulator goes to a logical high state, i.e. C=1, the data of the input buffer 10 is accessed by the latch 20 and data is shifted from the latch 20 to the latch 30.

The programmable logic array 60 restores, i.e. decodes, the data that has been encoded by the variable length encoder. The restored data is transmitted to the output buffer 70 to be stored.

In the variable length encoder, the data from the input buffer 10 is accessed by the latch 20 and shifted from the latch 20 latch 30 every time the latch enabling signal L takes the logic value 1 to fill the latches 20 and 30 with data under the control of the accumulator 50. The latch enabling signal L will take the logic value 1 three times if the length of the data to be read from the input buffer 10 is 24 bits. Thus, for each 16 bits of desired data in the input buffer 10, the latches 20 and 30 must be latched.

Moreover, the size of the programmable logic array 60 must be increased by 16 bit increments since the programmable logic array 60 needs a circuit large enough to deal with the 16 bit units of data received from the barrel shifter 40.

SUMMARY OF THE INVENTION

Accordingly, the present invention is directed to a variable length decoder that substantially obviates one or more of the problems due to limitations and disadvantages of the related art.

An object of the present invention is to provide an effective input/output operation of the data by having the data accessed with a multiplexer and latches (registers) in order to solve a problem of lowered operating speed caused by the decrease of bits of the data.

Another object of the present invention is to provide a decreased size of the data bus in an integrated circuit decoder (chip) by decreasing the number of bits of the output data.

To achieve these and other advantages and in accordance with the purpose of the present invention, as embodied and broadly described, the present invention provides a variable length codeword decoder comprising: a controller for generating a data access control signal, a multiplexing control signal and a shift control signal according to a word length of data that is to be outputted; a data storing device wherein a shift of previously-stored data is executed when said data access control signal is activated and new data is inputted into a space vacated by said shift; a multiplexing device for outputting selectively a portion of data stored in said first data storing device according to said multiplexing control signal; and a shifter for varying a shift pointer according to a value of said shift control signal and for operating upon data from the multiplexing device.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain, but not limit, the principle of the invention.

DETAILED DESCRIPTION OF PREFERRED EMBODIMENTS

Reference will be now made in detail to the preferred embodiments of the present invention, examples of which are illustrated in the accompanying drawings.

Figure 1:
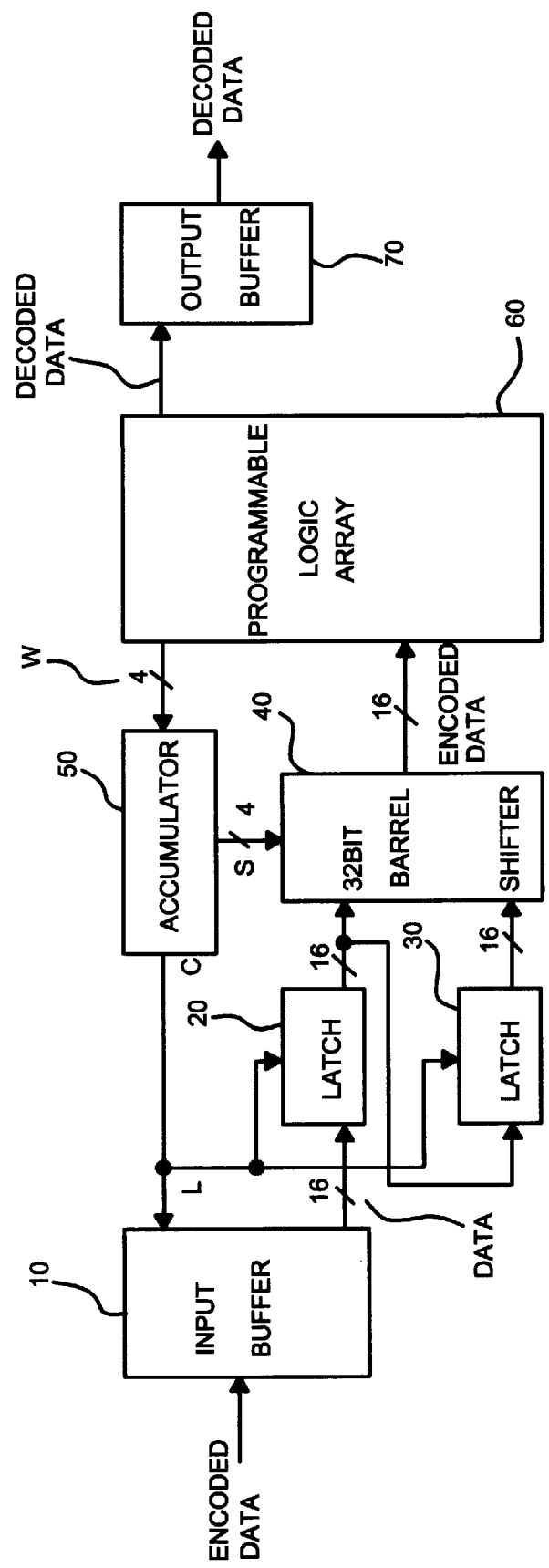
FIG. 1 shows the block a variable length decoder according to a related art.
Figure 2:
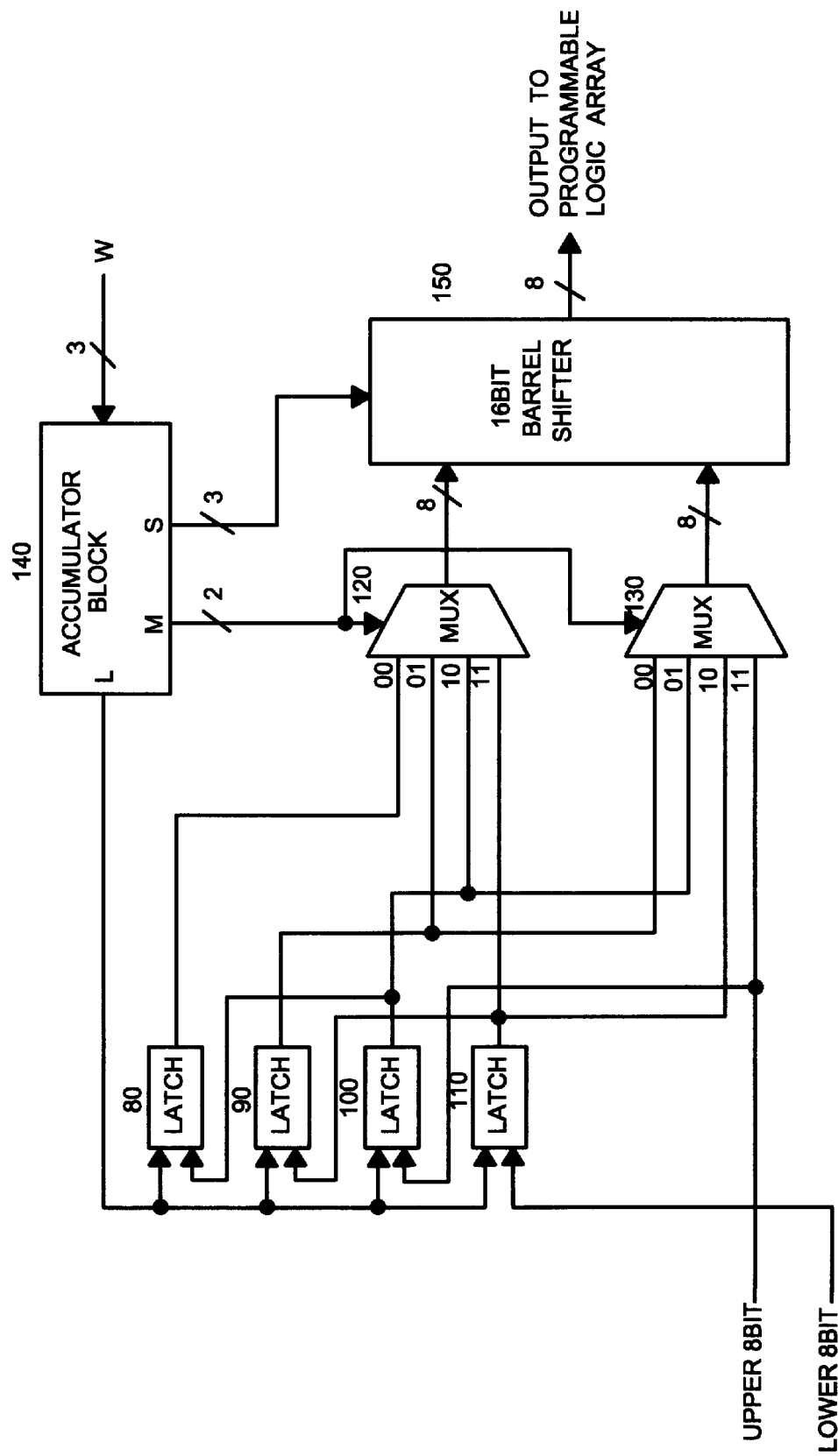
FIG. 2 shows the block diagram of a data varying device according to the present invention.

FIG. 2 shows the block diagram of a data varying device according to the present invention.

Referring to FIG. 2, an accumulator block 140 generates control signals, and has an input of word length W of 3 bits and an output of a latch enable signal L, a multiplexer control signal M of 2 bits and a shift pointer S of 3 bits. The length of the word W is determined by the length required by the programmable logic array which processes the variable length data inputted from the data length varying device of the invention.

The latch enable signal L controls the input/output of data for each of the four latches 80, 90, 100 and 110. The units of the input/output data are the same as the 8 bits passed through each latch (register) 80, 90, 100 and 110.

The upper 8 bits and the lower 8 bits are inputted into a pair of latches 100 and 110, respectively. The output data from the latches 100 and 110 are fed back so as to be inputted into another pair of latches 80 and 90, respectively. Whenever the latch enable signal L is activated, the data in the latches 100 and 110 is moved to the latches 80 and 90, respectively, and the empty latches 100 and 110 are filled with the upper 8 bits and lower 8 bits, respectively, of a new 16 bit unit of data. Consequently, 16 bit units of data are moved relative to the four latches 80, 90, 100 and 110 whenever the latch enable signal L is activated.

The multiplexer control signal M from the accumulator block 140 is provided to a pair of multiplexers 120 and 130. The multiplexer 120 selects one of the 8 bit units of data from the total of 32 bits that have been stored in the four latches 80, 90, 100 and 110. The other multiplexer 130 selects an 8 bit unit of data from the total sum of 32 bits represented by the upper 8 bits directly input thereto (i.e., which has not yet been inputted to the latches yet) and the 24 bits of data in the three latches 90, 100 and 110. The data outputted simultaneously from the multiplexers 120 and 130 represent a 16 bit unit of data corresponding to an upper 8 bits of data and a lower 8 bits of data, respectively.

The shifter pointer S is a shift variable which is inputted into the 16 bit barrel shifter 150. A programmable logic array (not depicted) is connected to the terminal of the barrel shifter 150 and processes a series of 8 bit data units from the barrel shifter 150. The data processed in the programmable logic array has a variable length according to the characteristics of, e.g., MPEG or JPEG. Thus, the data in units of 8 bits from the barrel shifter 150 not only can be processed all together but can also be partially processed. Accordingly, the initiating bit of the effective portion of the present data inputted in the barrel shifter 150 can be identified by transferring the information about the number of bits of the data which have not been processed to the barrel shifter 150 as a state of shifter pointer S.

Figure 3:
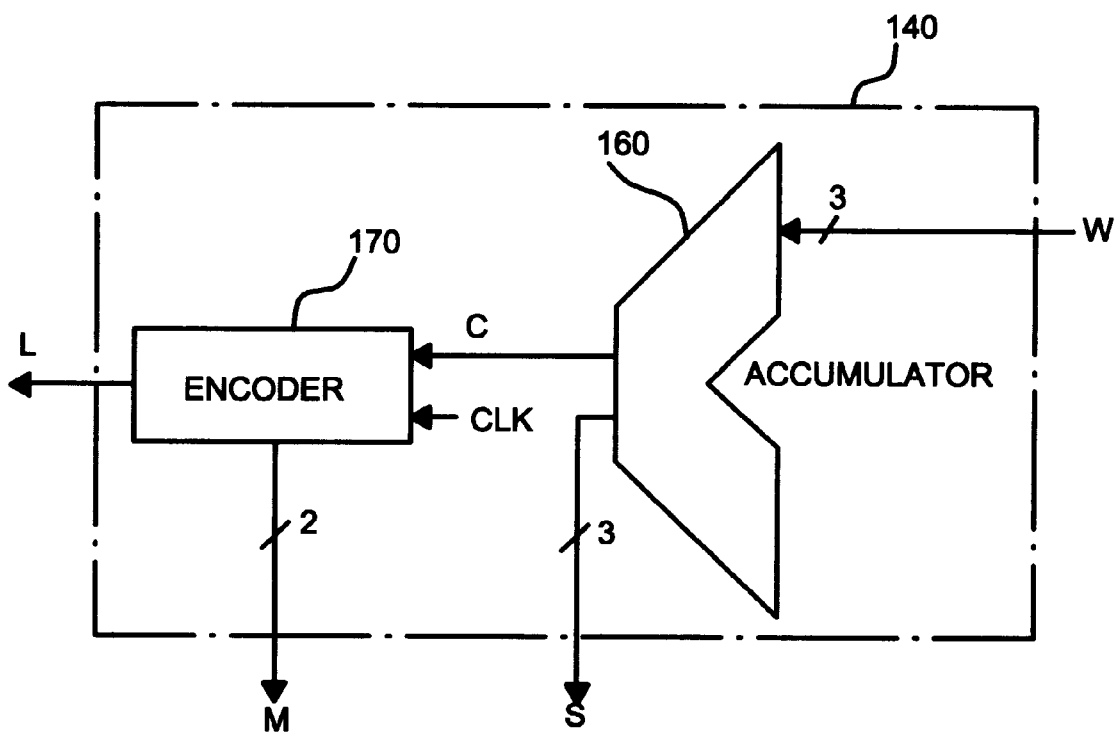
FIG. 3 shows the block diagram of an accumulator according to the present invention.

FIG. 3 shows the block diagram of the accumulator block 140 in FIG. 2 according to the present invention.

Referring to FIG. 3, the accumulator block 140 includes an accumulator 160 and an encoder 170. The word length w being newly inputted and the value having been stored are accumulated in the accumulator 160. The result of the accumulation except carry C is outputted as a shift pointer S, while the carry C is outputted to the encoder 170. Then, the encoder 170 outputs a latch enable signal L and a multiplexer control signal M in response to the carry C.

Figure 4:
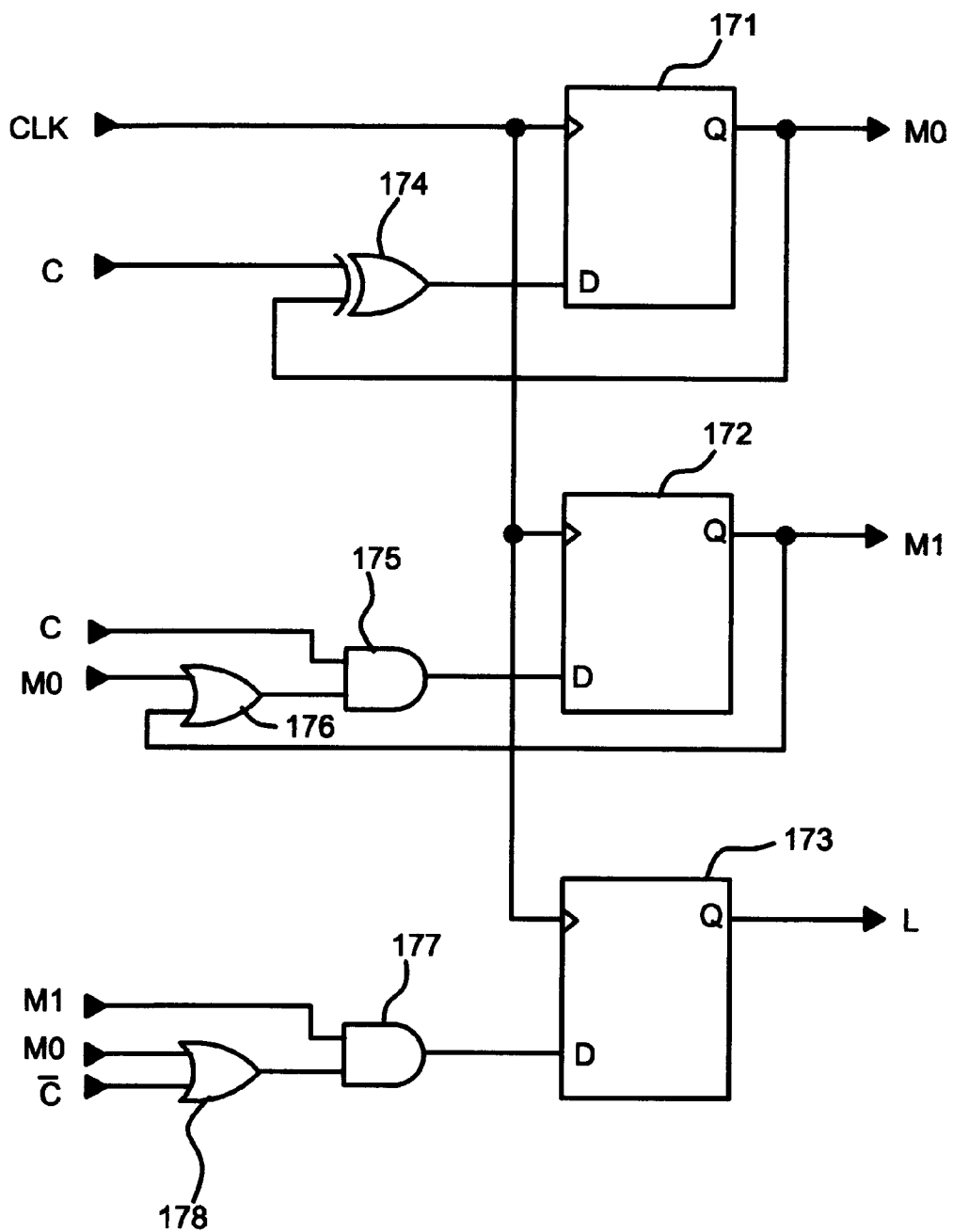
FIG. 4 shows the circuit of an encoder according to the present invention.

FIG. 4 shows the circuit of an encoder 170 in FIG. 3 according to the present invention.

The encoder generates both upper bit M1 and lower bit M0 of the multiplexer control signal M and a latch enable signal L through the D flip-flops 171, 172 and 173, wherein the flip-flops are synchronized by the same clock signal CLK.

An output of an exclusive OR gate 174 is provided to the D input of the D flip-flop 171, which generates the lower bit M0 of the multiplexer control signal M. The carry C outputted from the accumulator 160 is inputted to the XOR gate 174, while the lower bit M0 outputted from the D flip-flop 171 feeds back to the other input of the XOR gate 174. The logic value of the lower bit $M0_{n+1}$ outputted from the D flip-flop 171 on the (n+1)th clock is achieved by the arithmetic operation of the exclusive logic sum of the lower bit $M0_n$ outputted from the nth clock and the nth carry.

The output of AND gate 175 is provided to the D input of the flip-flop 172, which generates the upper bit M1 of the multiplexer control signal M. The output of the OR gate 176 is also inputted to the AND gate 175. The lower bit M0 of the multiplexer control signal M is fed back to the OR gate 176 into which the upper bit M1 of the multiplexer control signal M outputted from the D flip-flop 172 is fed back as well. The logic value of the upper bit $M1_{n+1}$ from the D flip-flop 172 at the (n+1)th clock results from the logical product of nth carry Cn 20 and the logic sum of both the nth lower bit $M0_n$ and nth upper bit $M1_n$.

The output of the AND gate 177 is provided to the D input of the flip-flop 173, which generates the latch enable signal L. The output of the OR gate 178 is provided to the AND gate 177 as 25 the other input. The inverted carry signal, IC, is inputted to the OR gate 178 with the fed-back lower bit M0 of the multiplexer control signal. The latch enable signal L outputted from the D flip-flop 173 results from the logical product of the previously-outputted upper bit M1 and the logic sum of both newly-inputted-inverted carry and previously-outputted lower bit M0. Hence, the logic value of the latch enable signal $L_{n+1}$ outputted according to (n+1)th clock is attained by logically multiplying the nth upper bit $M1_n$ by the logic sum of both the nth lower bit $M0_n$ and the nth inverted carry $/C_n$.

As is explained above, the value of the multiplexer control signal M maintains the binary value 00 such that the value of multiplexer control signal M is the binary value 00, when C=0. Once a carry C happens, i.e. C=1, the multiplexer control signal M becomes 01. Additionally, the latch enable signal maintains 0 in both cases.

When the value of the multiplexer control signal M is 01 and there is no occurrence of the carry C, the multiplexer control signal M remains at 01. Once the carry C happens again, the multiplexer control signal M becomes 10. In both cases, the latch enable signal L remains on 0.

Unless the carry C happens while the value of the multiplexer control signal M is 10, the multiplexer control signal M remains 00. When the multiplexer control signal M is 10 and the carry signal does not happen, i.e., C=0, then the latch enable signal L is 1. Once the carry C happens a third time, the multiplexer control signal becomes 11. When the carry happens, the signal L takes the value 0.

While the value of the multiplexer control signal M is 11, the multiplexer control signal M becomes 01 without the carry C, whereas the signal M becomes 10 with the carry C. In both cases, the latch enable signals have the value of 1 since the multiplexer control signals M are 11, regardless of the carry C.

For instance, the data variation operation according to the present invention with the input of optional word length L is as follows.

At the initial state of the circuit operation, the accumulator block 140 has an initial value of binary 000 and the carry has that of 0 as well. Accordingly, the latch enable signal L has a value of 0, the lower bit M0 and the upper bit M1 have an initial value of 0 respectively and the shift pointer S has an initial value of 000.

The upper 8 bits and the lower 8 bits, which in total represent a 16 bit unit of data, are inputted in the latches 100 and 110. The other latches 80 and 90 have not yet been inputted with any effective data. The multiplexer control signal M of 00 selects data having been stored in the latches 80 and 90, but there is no effective data in the latches 80 and 90 at this time to be outputted through the multiplexers 120 and 130 wherein the shift pointer S has an initial value of 000.

Once the latch enable signal L is activated to fill up the four latches 80, 90, 100 and 110, the upper 8 bits and the lower 8 bits having been stored in the latches 100 and 110 are moved to the latches 80 and 90, respectively, and then the latches 100 and 110 are filled up with a new upper 8 bits and a new lower 8 bits. Because the multiplexer control signal M is 00, the multiplexers 120 and 130 selectively connect data of the latches 80 and 90 to the barrel shifter 150.

During the above state, the accumulator 160 generates a new shift pointer S=011 by accumulating the newly-inputted word length W=011 and the initial value of 000 after the word length of the binary number 011 has been inputted into the accumulator block 140. Upon this accumulation, the carry C still keeps the logic value of 0 since there is no occurrence of the carry C.

The carry C of the logic value of 0 having been inputted into the encoder changes the output of the exclusive OR gate 174 in FIG. 4 into 0 when M=00. Thus, the datum of 0 is kept in the D flip-flop 171 whereinafter the datum 0 is outputted as a lower bit M0 with the activation of the clock CLK. The datum 0 is also kept in the D flip-flop 172 since the carry signal C of the logic value of 0 makes the output of the AND gate 175 a value of 0. A datum of 0 is also kept in the D flip-flop 173 as the logic value of the upper bit M1 makes the output of the AND gate 177 a value of 0. On the above state, once the clock CLK is activated, the data having been stored in each of the D flip-flops 171 to 173 are outputted to make the mutiplexer control signal have a value of 00 and the latch enable signal L have a value of 0.

In the above operation, the fact that the value of the word length W having been inputted into the accumulator 140 is 011 means that the upper 3 bits of the 8 bits having been supplied to the programmable logic array through the present barrel shifter 150 are used. Thus, the remaining 5 bits out of 8 are effective data. As the programmable logic array need not access new data, the multiplexer control signal M keeps the initial state of 00 and the latch enable signal L remains 0 such that a new data access is unnecessary.

Once a binary number of 111 of new word length W is inputted into the accumulator 160, the accumulator 160 accumulates the new word length W=111 and the present value of 011 so that a carry C=1 and new shift pointer S=010 are generated.

As the carry C of the logic value of 1 is generated during the state of 0 in the lower bit M0 and the upper bit M1 of the multiplexer control signal M, the output of the exclusive OR gate 174 in the encoder in FIG. 4 becomes 1 and then a datum of 1 is stored in the D flip-flop 171. Regardless of the carry C, the outputs of the AND gates 175 and 177 become 0 since the previous multiplexer control signal M has been 00. Thus, the data of 0 are stored in each D flip-flop 172 and 173. Once the clock is activated in the above state, the data having been stored in each of the D flip-flop 171 to 173 are outputted and the values of the multiplexer control signal M and the latch enable signal L become 01 and 0 respectively.

The value of the word length W having been inputted into the accumulator block 140 is 111, which means that 7 bits next to the upper 3 bits indicated by the present shift pointer among the data of 8 bits having been stored through the present barrel shifter 150 in the programmable logic array were used. However, the data of 8 bits having been supplied by the present barrel shifter 150 just contains the effective data of 5 bits, thus the next unit of 8 bits must be accessed to supply the additional 2 bits of data.

Namely, as the upper 8 bits among the data of 16 bits having been inputted into the barrel shifter 150 are no longer effective, the data having been stored in the latches 90 and 100 should be selected by changing the multiplexer control signal M into 01. Hence, a new data unit of 8 bits is additionally accessed by the upward 8 bit shift through the multiplexers 120 and 130.

Once the binary number 111 of the word length W is inputted again in the above state (old S=010), new shift pointer S=001 and the carry C=1 are generated from the accumulator block 140 wherein the newly-inputted word length of 111 is accumulated on the present value of 010.

As the carry C of logic value of 1 has been achieved under the condition that the upper bit M1 and the lower bit M0 of the multiplexer control signal M was 0 and 1 respectively, a datum of 0 is stored in the D flip-flop 171 by making the output of the exclusive OR gate 174 in the encoder in FIG. 4 have a value of 0 and the other datum of 1 is stored in the D flip-flop 172 according to the output value of 1 from the AND gate 175. However, a datum of 0 is stored in the D flip-flop according to an output of 0 from the AND gate 177 since the upper bit M1 of the present multiplexer control signal M is 0. Thus, the multiplexer control signal M is 0 and the latch enable signal L is 0.

Once the clock CLK is activated in the above state, the data having been stored in each of the D flip-flop 171 to 173 are outputted to make the multiplexer control signal M become 10 and also the latch enable signal L become 0, wherein an upward shift of 8 bits is carried out through the multiplexers 120 and 130 by of changing the multiplexer control signal M from 01 to 10. Namely, as the data unit of 8 bits having been supplied from the present barrel shifter 150 contains the effective data of 6 bits, a next data unit of 8 bits is accessed in order to be supplied with the additional 1 bit of data.

Accordingly, since the upper 8 bits of the data of 16 bits having been stored in the barrel shifter 150 are no longer effective, the data having been stored in the latches 90 and 100 is to be selected by changing the multiplexer signal into 01. Namely, a new data unit of 8 bits is obtained by performing another upward shift of a unit of 8 bits through the multiplexers 120 and 130.

Once new word length W of binary value 110 in the above state is received, a new shift pointer S of 111 is generated by accumulating the newly-inputted word length W of 110 and the previous shift pointer S of 001, without a carry being generated.

The carry C is not generated (C=0) under the condition that the upper bit M1 and the lower bit M0 of the multiplexer control signal M are 1 and 0, respectively. Thus, a datum of 0 is stored in the D flip-flop 171 according to the output of 0 from the exclusive OR gate 174 in the encoder in FIG. 4, and also a datum of 0 is stored in the D flip-flop 172 since the output of the AND gate 175 becomes 0 due to the carry C of the logic value 0. However, as the upper bit M1 of the present multiplexer control signal M is 1 and the inverted carry /C is also 1, the output of the gate 177 becomes 1. Thus, a datum of 1 is stored in the D flip-flop 173. Namely, the multiplexer control signal M becomes 00 and the latch enable signal L becomes 1.

As the latch enable signal L has been activated, the data unit of 16 bits having been stored in the latches 100 and 110 moves to the latches 80 and 90, and then a new data unit of 16 bits having an upper 8 bits and a lower 8 bits is accessed to fill the empty latches 100 and 110.

The data of the latches 80 and 90 are able to be accessed by the multiplexers 120 and 130 since the multiplexer control signal M is restored to 00. However, the data unit of 16 bits stored in the latches 80 and 90 is actually the previous data having been stored in the latches 100 and 110 before the multiplexer control signal M had gone back to 00. Thus, the data to be accessed by the multiplexers 120 and 130 are identical to the previous data which had been formed before the multiplexer control signal M went back to 00.

As 1 bit of the data, which is of the upper 8 bits in the 16 bit data unit stored in the barrel shifter 150, due to the shift pointer of 7 (i.e., 111), is still effective, a shift having a unit of 8 bits through the multiplexers 120 and 130 is unnecessary.

However, a new data unit of 16 bits is required for the latches 80, 90, 100 and 110 since the upper 16 bits of the 32 bits having been stored in the latches 80, 90, 100 and 110 have already been accessed through the multiplexers 120 and 130. Thus, a new data unit of 16 bits is accessed through the latches 80, 90, 100 and 110 by activating the latch enable signal L when the multiplexer control signal M is restored from 10 to 00.

Consequently, the present invention provides a variable length decoder having a reduced size of a chip by decreasing the size of the output data and improving the operation speed. The operation speed is improved by using multiplexers to access data stored in the latches (registers), and simultaneously enabling the effective input/output data processing by controlling the latches and multiplexers through a plurality of control signals generated by the accumulation of the word length.

It will be apparent to those skilled in the art that various modification and variations can be made in a variable length decoder of the present invention without departing from the spirit or scope of the inventions. Thus, it is intended that the present invention cover the modifications and variations of this invention provided they come within the scope of the appended claims and their equivalents.

What is claimed is:

1. A variable length codeword decoder comprising:
    a controller for generating a data access control signal, a multiplexing control signal and a shift control signal according to a word length of data that is to be outputted;
    a data storing device including a first latch unit and a second latch unit wherein a shift of previously-stored data from said first latch unit to said second latch unit is executed when said data access control signal is activated and wherein said first latch unit is connected to directly receive a first unit of bits of data inputted to said data storing device and said second latch unit is connected to directly receive a second unit of bits of the inputted data;
    a multiplexing device for outputting selectively a portion of data stored in said data storing device according to said multiplexing control signal; and
    a shifter for varying a shift pointer according to a value of said shift control signal and for operating upon data from the multiplexing device.

2. The variable length codeword decoder according to claim 1, wherein said controller comprises:
    an accumulator for generating said shift control signal by accumulating said word length inputted newly and a previous value of said shift control signal; and
    an encoder for generating said data access control signal and said multiplexer control signal as a function of a carry signal output by said accumulator.

3. The variable length codeword decoder according to claim 1, wherein said new data inputted into said first data storing device has twice a length of the maximum length of said word length.

4. The variable length decoder according to claim 1, wherein said shifter is provided with an output signal of said multiplexing device as a variable parameter and said shift control signal as a shift variable parameter.

5. The variable length decoder according to claim 1, wherein said shift pointer is a value denoting the position of data to be effective in another circuit connected to an output terminal when data stored in said shifter is outputted.

6. A variable length codeword decoder comprising:
    a controller for generating a data access control signal, a multiplexing control signal and a shift control signal according to a word length of data that is to be outputted;
    a data storing device wherein a shift of previously-stored data from a first location to a second location is executed when said data access control signal is activated and new data is inputted into said first location vacated by said shift;
    a multiplexing device for outputting selectively a portion of data stored in said data storing device according to said multiplexing control signal; and
    a shifter for varying a shift pointer according to a value of said shift control signal and for operating upon data from the multiplexing device:

wherein said controller comprises:
  an accumulator for generating said shift control signal by accumulating said word length inputted newly and a previous value of said shift control signal; and
  an encoder for generating said data access control signal and said multiplexer control signal as a function of a carry signal output by said accumulator; and
wherein said encoder comprises:
  a first logic unit including an exclusive OR gate and a second data storing device, said carry being input into said exclusive OR gate and an output of said exclusive OR gate being provided to said second data storing device as a first unit of bits of said multiplexer control signal, and said first unit of bits being fed back to another input of said exclusive OR gate;
  a second logic unit including a first OR gate, a first AND gate and a third data storing device, wherein said first unit of bits is input to said first OR gate, an output of said first OR gate and said carry are input to said first AND gate, an output of said first AND gate is provided to said third data storing device as a second unit of bits of said multiplexer control signal, and said second unit of bits is fed back to another input of said first OR gate; and
  a third logic unit including a second OR gate, a second AND gate and a fourth data storing device, wherein an inverted value of said carry is input with said first unit of bits to said second OR gate, an output of said second OR gate and said second unit of bits is input to a second AND gate, and an output of said second AND gate is output as said data access control signal.

7. The variable length codeword decoder according to claim 6, wherein said second to fourth data storing devices are D flip-flops performing synchronized input/output of data according to a common clock signal.

8. The variable length codeword decoder according to claim 1, wherein said first and second latche units have data storage capacity greater than the maximum size designated by said word length, and wherein said first unit or bits stored by said first latch is a lower unit of bits having the maximum size designated by said word length and said second unit of bits stored by said second latch is an upper unit of bits having the maximum size designated by said word length;
  said data storing device further including:
    a third latch; and
    a fourth latch;
    wherein data outputted from said first and second latches are inputted to said third and fourth latches, respectively, when said data access control signal is activated; and
    wherein new data are inputted into said first and second latches, respectively, according to said data access control signal when data having been stored in said first and second latches are outputted to said third and fourth latches, respectively.

9. The variable length decoder according to claim 8, wherein said multiplexing device comprises:
  a first multiplexer outputting selectively data stored in one of said first/to third latches and representing an upper unit of bits having the maximum size designated by said word length according to said multi-control signal; and
  a second multiplexer outputting selectively data stored in said first to fourth latches according to said multi-control signal.

\* \* \* \* \*